United States Patent [19]
Crocker

[11] Patent Number: 5,812,831
[45] Date of Patent: Sep. 22, 1998

[54] METHOD AND APPARATUS FOR PULSE WIDTH MODULATION

[75] Inventor: Paul R. Crocker, Austin, Tex.

[73] Assignee: Motorola, Inc., Schaumburg, Ill.

[21] Appl. No.: 635,991

[22] Filed: Apr. 22, 1996

[51] Int. Cl.[6] ..................................................... G06F 1/04
[52] U.S. Cl. ............................ 395/555; 395/556; 327/175
[58] Field of Search .................................. 395/555, 556, 395/557, 558; 327/172, 173, 174, 175, 291

[56] References Cited

U.S. PATENT DOCUMENTS

| | | | |
|---|---|---|---|
| 4,550,307 | 10/1985 | Akashi et al. | 341/144 |
| 5,293,628 | 3/1994 | Langan et al. | 395/550 |
| 5,402,009 | 3/1995 | Kiyota | 327/176 |
| 5,418,932 | 5/1995 | Watabe et al. | 395/555 |

OTHER PUBLICATIONS

Wright, Jeff; "Multichannel PWM TPU Function (MCPWM);" Motorola, Inc.; 1993; pp. 1–35.

Dipl.–Ing. Michael Heiss, et al; "Pulsanzahlmodulator als D/A–Umsetzer;" Elektronik; 1989; pp. 96–98.

*Primary Examiner*—Dennis M. Butler
*Attorney, Agent, or Firm*—Susan C. Hill

[57] ABSTRACT

A method and implementing circuit for converting a digital signal to an analog equivalent by providing a pulse width modulated (PWM) output signal in various formats which result in an analog equivalent signal with a substantially lower harmonic distortion profile. Counter circuitry (e.g. 301–305) with input registers (e.g. 307–311) are implemented to establish switching points at predetermined count values (e.g. 4C3) within the period of an output signal (PWM OUTPUT). In one embodiment, delay circuitry (303, 309) is effective to delay the beginning of an output pulse so that the pulse is centered, or otherwise selectively positioned within an output signal period to minimize harmonics, and the pulse duration is set to correspond to a digital value to be converted. In other implementations, subcycles are defined and output pulses are established within such subcycles to provide the low harmonic output signal while maintaining an analog equivalence value of a digital input. Signal edge control techniques are also implemented to insure the same number of signal transitions per output signal period, independently of the data values input to the PWM circuitry. One embodiment permits an increase of the input rates for the pulse width and positioning input signals to a rate higher than a rate corresponding to a selected output period in order to move frequency domain images of the input signals to a higher frequency level where they may be more easily filtered.

25 Claims, 7 Drawing Sheets

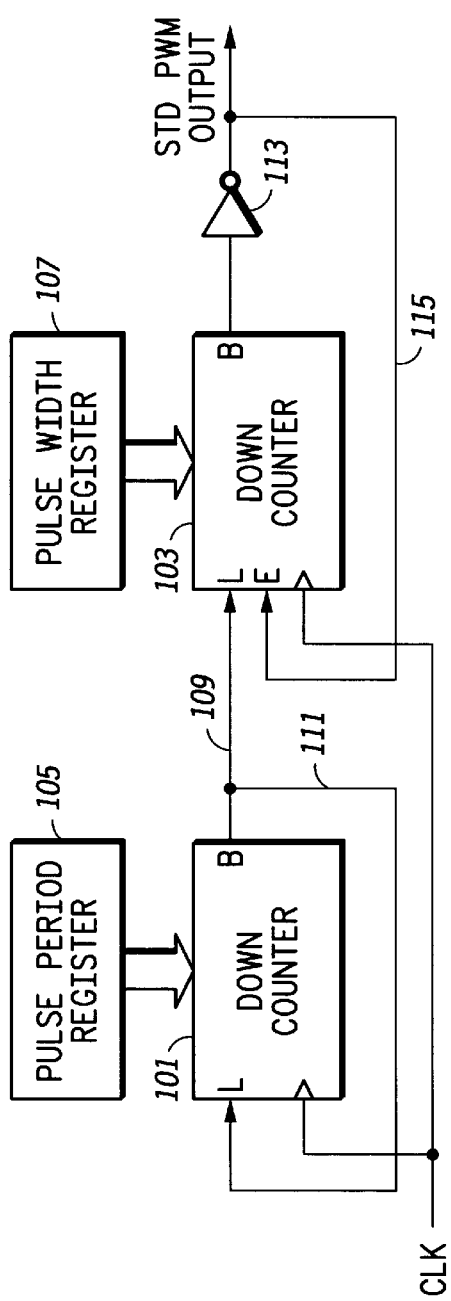
FIG.1 —PRIOR ART—
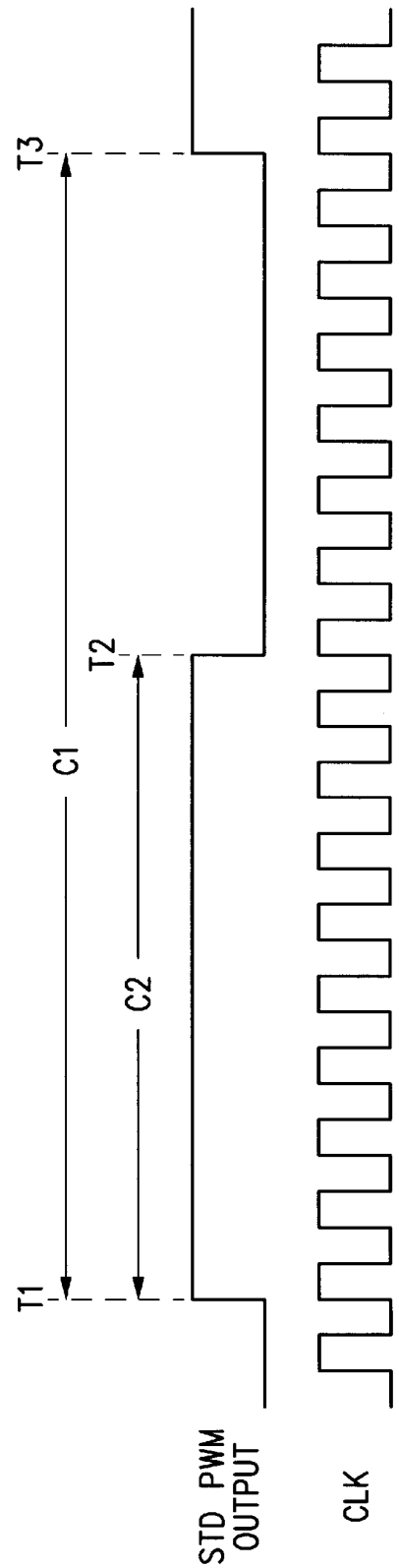
FIG.2

METHOD AND APPARATUS FOR PULSE WIDTH MODULATION

FIELD OF THE INVENTION

The present invention relates generally to electronic signal conversion circuits and more particularly to pulse width modulator circuits.

BACKGROUND OF THE INVENTION

Pulse width modulator (PWM) circuits are often used as an inexpensive digital to analog converter (DAC). The standard PWM circuit performs well when the task is to output signals that change only very slowly with time. PWM DACs also perform well when outputting "tones" or sine waves, the periods of which are integer multiples of the fundamental clock period. Both of the above uses represent common applications of the PWM and have resulted in a widespread use of the standard PWM.

Voice data, however, cannot be characterized as slowly moving with time, or as a sequence of simple tones. In the frequency domain, voice data appears as a block of frequencies from a DC level out to several thousand hertz. The conversion of voice type data to the analog domain has long been a requirement in the telephony industry. Standard converters have been used to implement the conversion of voice data to the analog domain such as switched capacitor converters and delta-sigma converters. The requirement for the conversion of voice data has been moving to inexpensive devices such as "personal digital assistants" (PDAs) and pagers. The standard PWMs found on these relatively inexpensive devices do not perform as well as the more sophisticated converters found in the telephony industry.

Thus there is a need for an improved and cost effective pulse width modulator device with improved performance characteristics in voice to analog applications.

BRIEF DESCRIPTION OF THE DRAWINGS

A better understanding of the present invention can be obtained when the following detailed description of a preferred embodiment is considered in conjunction with the following drawings, in which:

FIG. 1 is a block diagram illustrating a standard PWM implementation;

FIG. 2 is a waveform chart referred to in explaining the operation of a 4-bit example of the circuit illustrated in FIG. 1;

DESCRIPTION OF THE PREFERRED EMBODIMENTS

Figure 3:
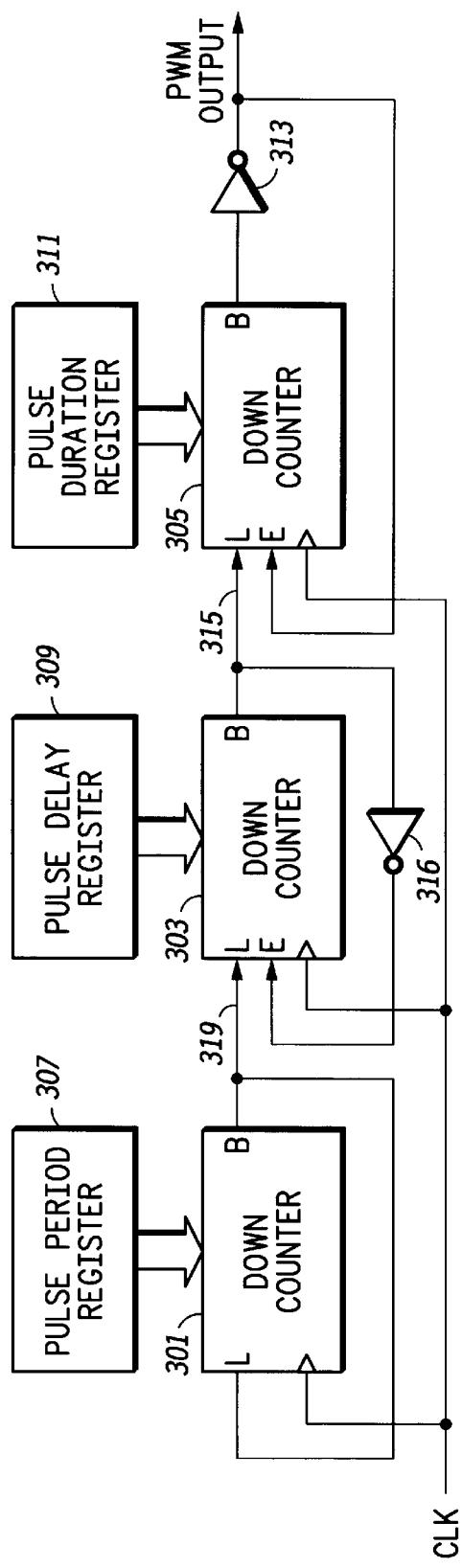
FIG. 3 is a block diagram illustrating a pulse centered PWM implementation.

In the description of the drawings, several exemplary implementations of an improved pulse width modulator (PWM) circuit are discussed. In the examples that follow, except as otherwise specified, the operation is explained in connection with a 4-bit data word "1001", and it is understood that the principles of the present invention apply to any data word of any width. The illustrated circuits include a "Pulse Centered PWM", a "Subcycle PWM" and a combination implementation which includes characteristics of both Pulse Centered and Subcycle techniques. An "edge control" method is also implemented and effective such that the inaccuracies of an analog output signal add a fixed error rather than a more perceptible signal dependent error.

In the illustrated examples, the counters utilized are "down-counters" although it is understood that "up-counters" with associated comparators, may also be implemented. The "borrow" or "B" output of the down counters is true when the count value is equal to all "0s". This is analogous to the "carry" output of an up-counter that goes true when the count value is equal to all "1s". In all examples, the down counters used are synchronous counters. The outputs change only on a positive transition of the clock input. If the "Load" or "L" input is at a "TRUE" state, the counter value changes to the "input" value from an associated input register on the clock transition. If the "LOAD" or "L" input is at a "FALSE" logic level, and the "ENABLE" or "E" input is "TRUE", the counter decrements on the clock transition. If the "L" and "E" inputs are both at a "FALSE" logic level, the counter value does not change on the clock transition.

In the following examples, when the down-counters are used to time a period or delay, the down-counter cycles from a value of "period minus 1" down to "0", and so the register that feeds the down-counter is loaded with a value that is 1 less than the desired period or delay. When the inverse of the "Borrow" output of the down counters is used to generate a pulse, the counter cycles from "width" down to "zero", but the "Borrow" output is FALSE only from "width" down to "1". Thus, the pulse output is TRUE when the Borrow output is FALSE. In these cases, "width" is loaded into the register that feeds the counters and not "width minus 1".

As shown in FIG. 1, a block diagram of a standard PWM circuit consists of a first down-counter 101 and a second down-counter 103, both of which having clock input terminals arranged to receive a clock signal CLK. The first counter 101 is coupled to a first register (PULSE PERIOD REGISTER) 105 and the second counter 103 is coupled to a second register (PULSE WIDTH REGISTER) 107. The first counter 101 has its "BORROW" or "B" output terminal connected 109 to an input or "LOAD" or "L" terminal of the second counter 103 as well as in a feedback loop 111 to the input or LOAD terminal "L" of the first counter 101. The second counter 103 has its output terminal "B" connected through an inverter 113 to provide a circuit output signal designated as the standard PWM Output signal STD PWM OUTPUT. The output from the inverter 113 is also connected by line 115 to a second or "ENABLE" terminal "E" of the second counter 103. The PWM OUTPUT signal in FIG. 1, and also the corresponding PWM output signals from the circuitry illustrated in FIG. 3, FIG. 5 and FIG. 7, may be further connected to a D-type flip-flop circuit or similar circuit (not shown) to insure that the Output signal changes with a fixed delay relative to the Clock signal CLK, and is not dependent on the various paths through the PWM circuit.

In FIG. 2, a chart of a 4-bit standard PWM signal STD PWM OUTPUT is shown relative to the clock signal CLK. The chart also shows period C1 which equals the period of the STD PWM OUTPUT signal (T3–T1), as well as the pulse width C2 of the STD PWM OUTPUT pulse (T2–T1). In the illustrated example, the "PULSE PERIOD" is decimal "16" clocks, and the "PULSE WIDTH" is decimal "9" clocks. The value set into the first register 105 will therefore be "15"(to count sixteen counts from "15" down to "0") and the count set into the second register 107 will be "9". The first register 105 is set to the pulse period C1 minus "1"(i.e. "15"), and the second register 107 is set to the pulse width C2 (i.e. "9"). In the example illustrated, a pulse width of nine clock pulses C2 is used and an STD PWM OUTPUT signal period of sixteen clock pulses C1 is provided. The pulse period counter 101 counts down from the "15" CLK number set into the register 105. When counter 101 reaches "0", counter 103 is loaded, and the cycle begins. For width values other than "0", the STD PWM OUTPUT signal goes high, and the pulse width counter 103 begins to count down from the pulse width register 107 setting of "9" CLK pulses. While the pulse width counter 103 decrements nine counts from "9" to "1", the STD PWM OUTPUT signal is HIGH. When counter 103 reaches "0", the STD PWM OUTPUT goes FALSE or low and the counter 103 is stopped. On the next clock after a count of "0" is reached by counter 101, the STD PWM OUTPUT signal goes high again to begin another signal cycle. As can be seen, the percentage of time during which the STD PWM OUTPUT signal is "high" can be varied by varying the count or value set into either registers 105 or register 107 or both.

One counter 101 counts down from a number one less than the period of a cycle ("16–1=15") and the second counter 103 counts down from the "pulse width"(i.e. "9") in the present example. If the PWM pulse width is low pass filtered, the circuit acts as a Digital to Analog Converter (DAC) the output of which is proportional to the "pulse width" divided by the "period". This ratio is multiplied by the reference voltage level, typically Vdd. The relationship of the two counters to the output waveform is illustrated in FIG. 2 for the case of a four-bit counter. If a sound file is "played" through this PWM circuit, typically, the period (1st register value plus "1") remains constant and the pulse width (2nd register value) is updated on each cycle of the 1st counter. In other words, the sampling frequency of the file is the quantity ("1" divided by the 1st register value plus "1") multiplied by the clock frequency. A Fourier Transform of a standard 8-bit PWM output when the input is a "digital" representation of a sine wave has a second harmonic 20 db down from the fundamental, meaning that the "total harmonic distortion" (THD) can be no less than 10%. Since the frequency of the second harmonic is always twice that of the signal, the second harmonic tracks the signal and cannot be filtered.

In FIG. 3, a block diagram illustrating a pulse centered PWM implementation is shown. A first down-counter 301 is coupled to a second down-counter 303 which, in turn, is connected to a third down-counter 305. The first second and third counters 301, 303 and 305, each are coupled to corresponding first, second and third registers 307, 309 and 311. Registers 307, 309 and 311 are designated as a Pulse Period Register, a Pulse Delay Register and a Pulse Duration Register, respectively. Each of the counters 301, 303 and 305 has a CLK signal applied to a clock input terminal thereof. The output "B" of the counter 301 is connected 319 to a "LOAD" input terminal "L" of the second counter 303 and also connected to the "LOAD" input terminal of the first counter 301. The output of the second counter is connected 315 to the "Load" input terminal ("L") of the third counter 305 and also through an inverter 316 to the E input terminal of the second counter 303. The output "B" of the third counter 305 is connected to an inverter 313 which provides a PWM OUTPUT signal PWM OUTPUT. The PWM OUTPUT signal is also applied to the E input terminal of the third counter 305.

Figure 4:
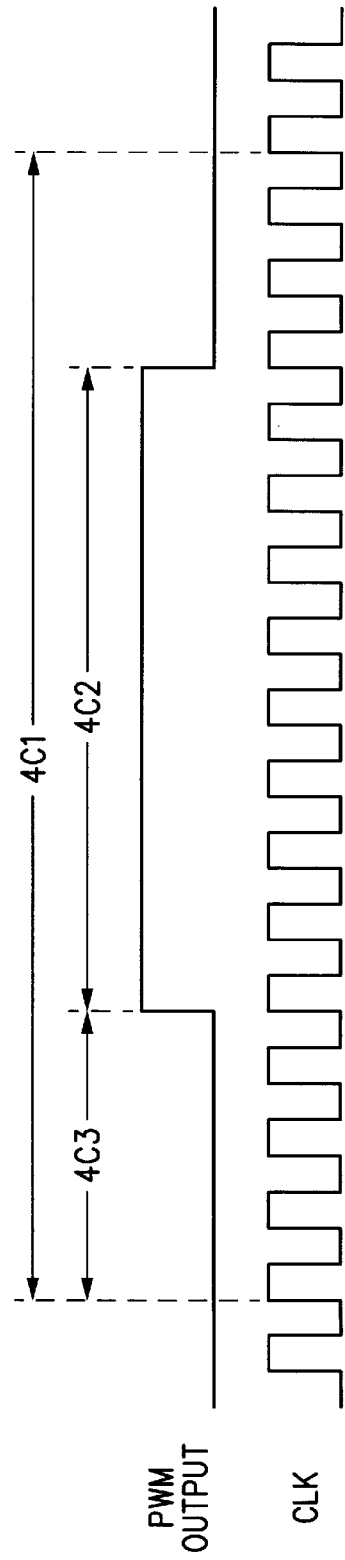
FIG. 4 is a waveform chart referred to in explaining the operation of the circuit illustrated in FIG. 3.

With reference to FIG. 4, it is noted that the first or Period Register 301 is arranged to hold a value representative of a pulse period minus "1" ("4C1–1" in the present example), while the second or Pulse Delay Register 309 is designed to contain a count or value representative of a pulse delay minus "1" ("4C3–1") in the present example). The third or Pulse Duration Register 311 is designed to contain a value representative of a pulse duration, ("4C2" in the present example). As shown, "4C3" is equal to a delay of four CLK pulses, "4C2" is equal to a pulse duration of nine CLK pulses, and "4C1" is equal to a PWM OUTPUT signal period of sixteen CLK pulses.

In operation, the implementation of FIG. 3 for an 8-bit PWM provides an output signal PWM OUTPUT with a substantially improved Total Harmonic Distortion (THD). The second harmonic is 40 db down from the fundamental which represents a tenfold improvement over the FIG. 1 implementation. In FIG. 3, the added counter circuitry, i.e. counter 303 and register 309, is effective to implement a delay "4C3", which is representative of the count i.e. "3", in the second register 309, between the beginning of the PWM OUTPUT signal cycle to the beginning of the high level pulse portion of the PWM OUTPUT signal. As an option, since delay counter 303 and pulse width counter 305 do not operate at the same time, it is possible to share a single counter for both the delay and pulse width functions. Note that the pulse delay value can also be easily derived from the pulse duration value and is not required to be an external input provided to the PWM.

Figure 5:
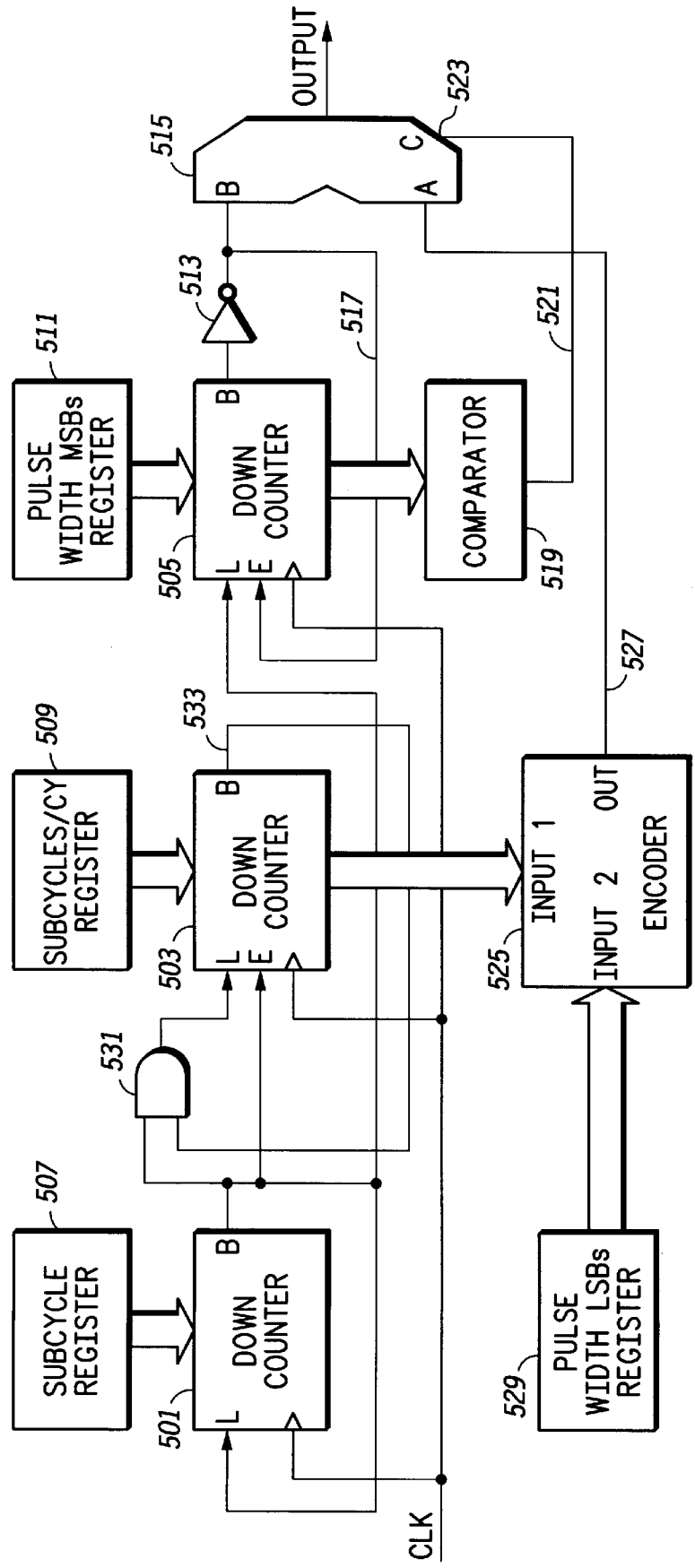
FIG. 5 is a block diagram illustrating a subcycle PWM implementation.

FIG. 5 is a block diagram illustrating a Subcycle PWM implementation. First, second and third counters 501, 503 and 505, respectively, are coupled to first second and third registers 507, 509, and 511, respectively. The first register stores a value representative of the number of CLK signals per subcycle (less "1" in the present example). The second register stores a value representative of the number of subcycles per cycle (minus 1 in the present example). The third register stores a value representative of the MSBs of the total pulse width. Each counter 501, 503 and 505 receives a clock signal CLK input. The output terminal "B" of the third counter 505 is connected through an inverter to a B terminal of a multiplexer 515. The multiplexer 515 provides an output signal OUTPUT. The output terminal of the inverter 513 is also connected 517 to the "E" input terminal of the third counter 505.

A comparator 519 receives an input from the third counter 505 and provides an output which is connected 521 to a "C" terminal 523 of the multiplexer 515. An encoder circuit 525 receives inputs from the second counter 503 and a fourth register 529 and has an output terminal connected 527 to an "A" input terminal of the multiplexer 515. The fourth register 529 stores a value representative of LSBs of the pulse widths. The output from the second counter 503 is connected by line 533 to one input terminal of an AND gate 531. And gate 531 receives another input from the B output of counter 501. The output of AND gate 531 is connected to the L input terminal of the second counter 503. The B output from the first counter 501 is also connected to the "E" input terminal of the second counter 503 and also to the "L" input terminals of the first and third counters 501 and 505.

In operation, the first down counter of the subcycle PWM illustrated in FIG. 5 continuously counts and reloads from the Subcycle Register 507. Each time the value in counter 501 reaches zero, the "B" output goes high. As the "B" output of counter 501 goes high, three events are set-up viz. (1) the first counter 501 is enabled for reload on the next clock pulse, (2) the second counter 503 is enabled to count or load on the next clock pulse, and (3) the third counter 505 is reloaded. The second counter 503 keeps track of the number of subcycles within each cycle of the PWM signal. Accordingly, counter 503 is decremented only once per subcycle. When the value or count of the second counter 503 reaches zero, its "B" output signal goes high and the next time it is enabled by the first counter 501, counter 503 reloads from its associated register 509. The third counter 505 counts out the base pulse width determined by the most significant bits (MSBs) of the pulse width word and then stops. For example, for a pulse width of "9" or "1001", the base width is "10". The base pulse width is the same for all subcycles within a cycle. In the 4-bit example, counter 505 loads in a "10" and counts to "00" and then stops until its LOAD input L again goes high at which time it will repeat its counting operation. It is noted that the "B" output of counter 505 is "false" or "low" during two clock cycles "10" and "01". The inverse of the "B" output is the same as the base, or MSB, part of the pulse width shown in FIG. 6. It is also noted that the inverse of the "B" output is also used to stop the counter 505. Accordingly, counter will stop at a value of "..00" until it is reloaded by a true or high signal level on its "L" input.

The current count value of the second counter 503 is fed to an encoder circuit 525 along with a word representing the least significant bits (LSBs) of the desired pulse width. The encoder is a combinational logic block. That logic acts to "spread" the LSB weights across the subcycles within a cycle. In the 4-bit example, Pulse Width LSBs Register 529 is loaded with "01" and the output of the second counter 503 decrements from "11" to "00" as previously described. The comparator 519 connected to the output of the third counter 505 is used to position the LSB portion of the pulse just after the base, or MSB portion of the pulse. The third counter 505 reaches a value of ". . . 001" on the last clock cycle of the base pulse width. The comparator 519 recognizes that state and steers the multiplexer 515 to the output of the encoder 525 for the one clock cycle per subcycle.

The Encoding Table for the LSBs of the subcycle PWM Encoder 525 is set forth below, where "X" represents a non-mandatory condition, i.e. the "X" state can be either "1" or "0", where each group of horizontal dots ". . . " indicates a break in the series that may be filled with any number of Xs or 1s that are the same as the adjacent characters, and where the vertical dots indicate a break in the series which may be filled in using the same pattern as shown.

| INPUT 1 | INPUT 2 | OUT |
| --- | --- | --- |
| X . . . XXX0 | 0XXX . . . X | 0 |
| X . . . XXX0 | 1XXX . . . X | 1 |
| X . . . XX01 | X0XX . . . X | 0 |
| X . . . XX01 | X1XX . . . X | 1 |
| X . . . X011 | XX0X . . . X | 0 |
| X . . . X011 | XX1X . . . X | 1 |
| . | . | . |
| . | . | . |
| . | . | . |
| 01 . . . 11 | XX . . . XX0 | 0 |
| 01 . . . 11 | XX . . . XX1 | 1 |
| 11 . . . 11 | XX . . . XXX | 0 |

Figure 6:
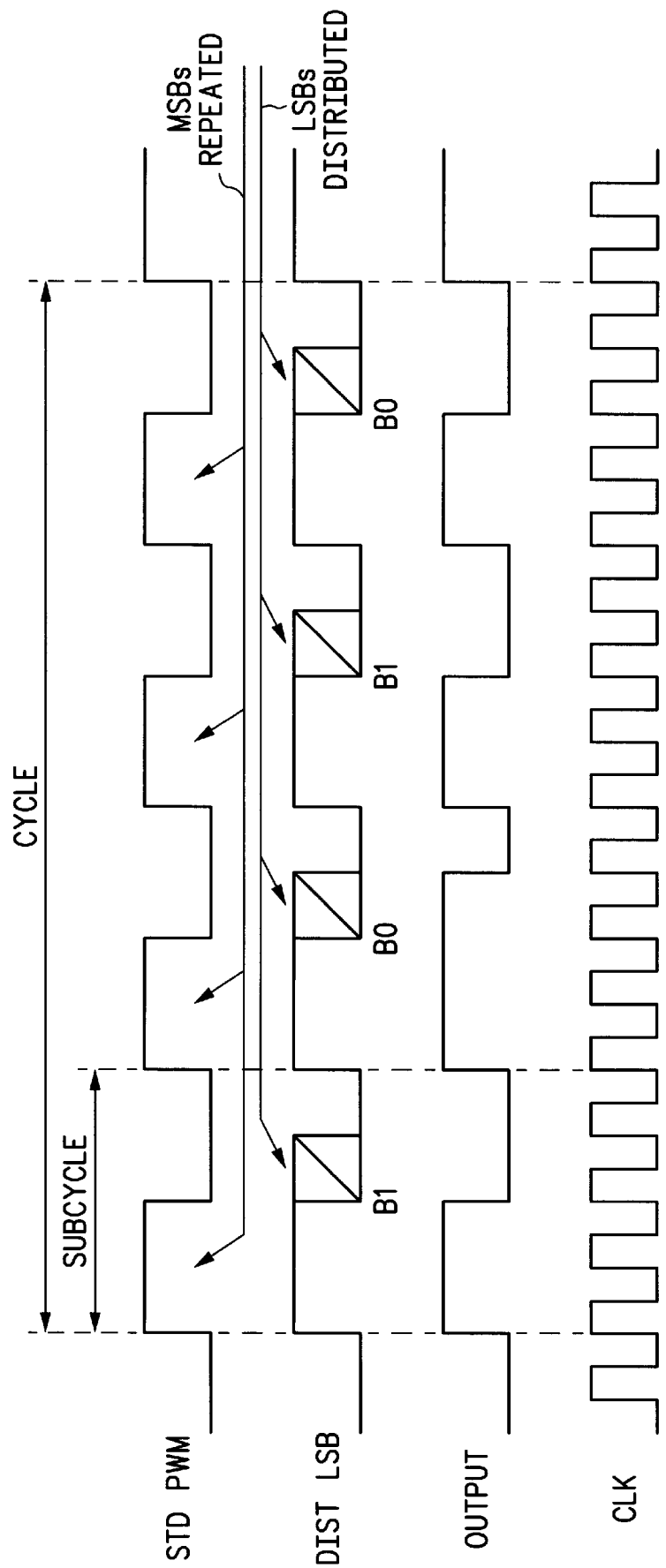
FIG. 6 is a waveform chart referred to in explaining the operation of the circuit illustrated in FIG. 5.

In FIG. 6, the cycle of the PWM is divided into subcycles. There is normally an integer number of subcycles in each cycle, and it is the most straightforward to implement when this integer is a power of "2". Examples for the 4-bit case are: 2 subcycles of 8 clock pulses (CLKs) each; 4 subcycles of 4 CLKs each (as shown in FIG. 6); and 8 subcycles of 2 CLKs each. The pulse within each subcycle is built in the following manner. A standard PWM is formed in each subcycle using the most significant bits (MSBs) of the pulse width input. The base pulse width so formed remains constant for all of the subcycles within a cycle.

There will always be at least 1 "spare" clock cycle in each subcycle. In the example, a subcycle can represent at most 3 CLKs out of every four available. Next, the values of the least significant bits (LSBs) are distributed across these "spare" clock cycles. There are several possible patterns for distributing these bits, with the goal being to distribute the energy of each bit as much as possible across the full cycle. In the example of FIG. 6, b1 is inserted twice because it has a weight of "2", but it is not inserted into adjacent time slots. The dock cycles representing the LSBs of the pulse width (shown hatched in FIG. 6), are placed adjacent to the base pulses generated by the MSBs of the pulse width. These clock cycles must then "slide" or shift within the subcycle as the MSBs change. The Fourier Transform for an 8-bit Subcycle PWM is down more than 40 db. This represents a ten-fold improvement over the implementation of FIG. 1.

Figure 7:
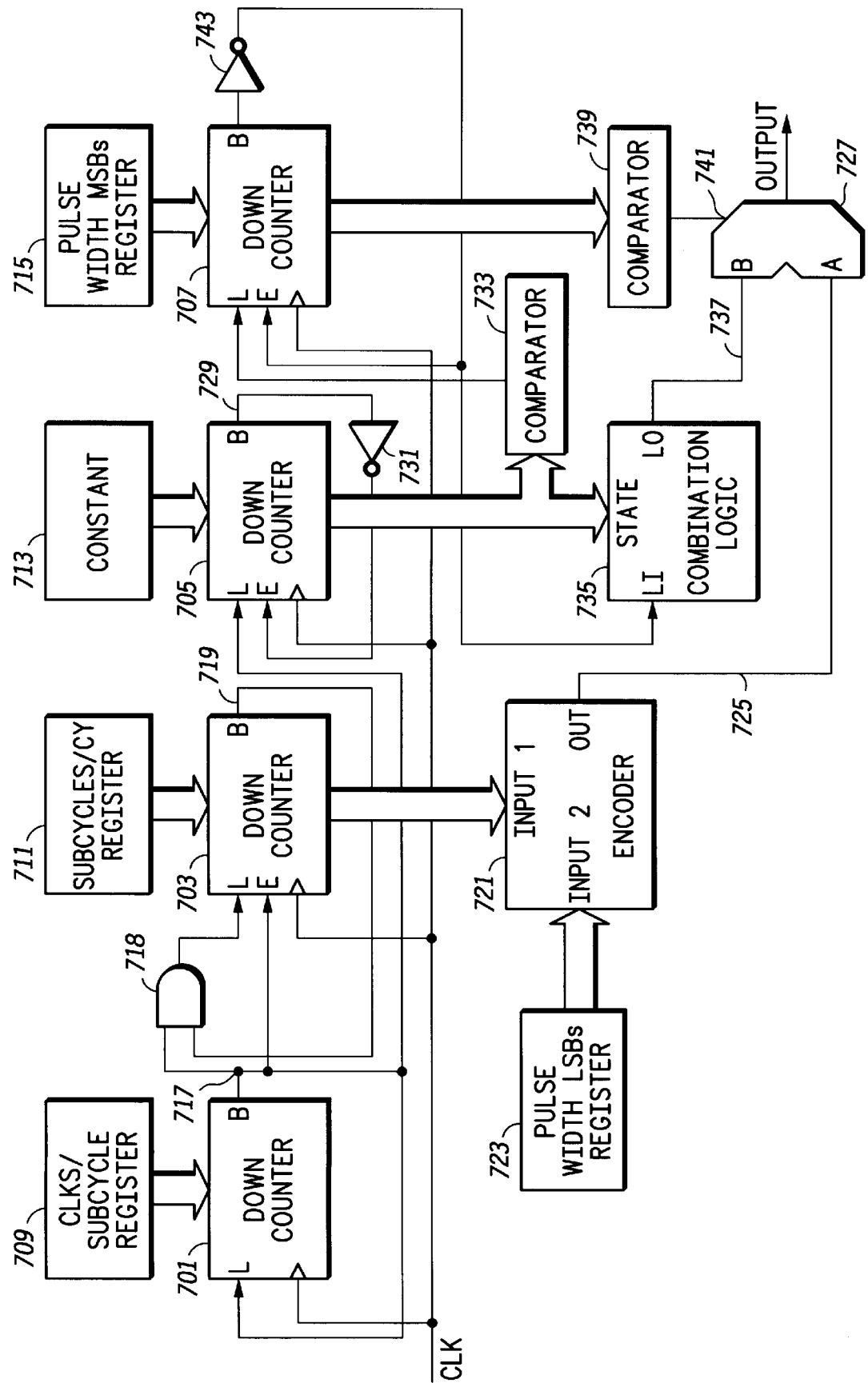
FIG. 7 is a block diagram illustrating a subcycle PWM circuit using an edge control implementation.

FIG. 7 is a block diagram illustrating a subcycle PWM circuit using an edge control implementation. As illustrated, the exemplary circuit embodiment includes first, second, third and fourth counters 701, 703, 705 and 707, respectively. Each of the first, second and fourth counters, 701, 703, and 707, is coupled to a corresponding register 709, 711 and 715, respectively. The third counter 705 is coupled, in the present example, to a hard-wired constant value of "10" represented by block 713. The first register 709 stores a count value representative of the number of CLK pulses per subcycle minus "1", while the second register 711 stores a count value representative of the number of subcycles per cycle minus 1. The block 713 represents a binary constant "10", and the third register 715 stores a count value representative of the MSBs of the pulse width. The output 717 of the first counter 701 is connected to one input terminal of an AND gate 718 and also to the "E" input terminal of the second counter 703 and the "L" input terminals of the first and third counters 701 and 705, respectively. The output 719 of the second counter 703 is fed back to the other input terminal of the AND gate 718. The output of the AND gate 718 is connected to the "L" input terminal of the counter 703.

An encoder circuit 721 receives inputs from the second counter 703 and also from a register 723. The register 723 stores a count value representative of the LSBs of the pulse width. The output from the encoder 721 is connected 725 to an "A" input terminal of a multiplexer 727. An output 729 from the third counter 705 is connected through an inverter 731 to an "E" input terminal of the counter 705. A comparator circuit 733 receives an input from the third counter 705 and applies an output signal to the "L" input terminal of the fourth counter 707. A Logic Block or Logic Circuit 735 also receives an input ("STATE") from the third counter 705 and has an output thereof "LO" connected 737 to a "B" terminal of multiplexer 727. Comparator 739 receives an input from the fourth counter 707 and applies a control signal to the select terminal 741 of the multiplexer 727. The multiplexer 727 provides an output signal OUTPUT. The output from the fourth counter 707 is connected through an inverter 743 to provide an input signal to the "E" input terminal of fourth counter 707 as well as providing an input "LI" to the Logic Circuit 735.

The Logic Circuit 735 may be implemented in any one of many logic circuit designs which will effectuate the following Truth Table:

| LI | STATE | LO |
|----|-------|-----|
| 0  | 00    | 0  |
| 0  | 01    | 1  |
| 0  | 10    | 0  |
| 0  | 11    | X  |
| 1  | 00    | 1  |
| 1  | 01    | 1  |
| 1  | 10    | 0  |
| 1  | 11    | X  |

Figure 8:
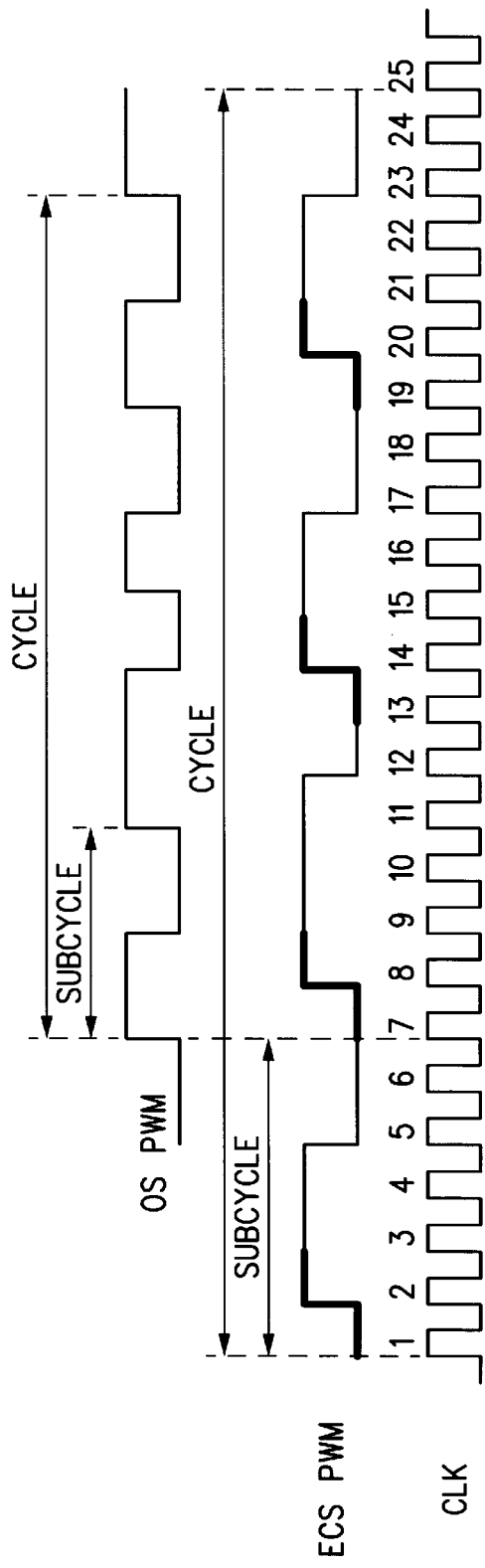
FIG. 8 is a waveform chart referred to in explaining the operation of the circuit illustrated in FIG. 7.

The exemplary edge control circuitry shown in FIG. 7 can be used with any of the PWM methods but it is most useful in the case of the subcycle PWM. Edge control is achieved by adding a "0-to- 1" transition in each subcycle just before the normal pulse as shown in FIG. 8. The purpose of edge control is to insure the same number of signal transitions per cycle, independently of the data values input into the PWM. In this way the inaccuracies of the analog output circuit add a fixed error, instead of a more perceptible signal dependent error. A "1001" code example happens to be a degenerate case for edge control. With a code of "1111", without edge control there would be only one transition per cycle. With edge control, there are four transitions just as in the "1001" example.

The exemplary implementation of subcycle PWM with edge control as shown in FIG. 7 is similar to the subcycle PWM without edge control shown in FIG. 5. The Encoding Table for Encoder 721 is the same as the table previously illustrated for the Encoder 525. To add edge control, the fourth down counter 705 must be added before the last counter 707. Without edge control, the first counter (Subcycle) enabled the last counter (MSBs of the pulse width) at the beginning of each subcycle. With edge control, the first counter enables the newly inserted counter 705. The new counter 705 is an implementation of a state machine. When the Load input L of the state machine goes high or true, it is forced into state "10" on the next clock cycle. The state machine then counts down to state "00" and stops. The state of the state machine 705 is fed to the logic block 735 as shown. The logic block 735 is similar to a multiplexer but can be implemented more efficiently with custom logic. As the state machine 705 counts "10", "01", "00", the output of the logic block 735 is "0", "1", "base pulse". "Base pulse" is the inverted output from the last counter and has the same meaning as it did in the PWM without edge control. The loading of the last counter 707, which is what initiates the base pulse, has been delayed by two clock cycles. That is done by controlling the counter with the state of the state machine 705 instead of the B output from the first counter 701. The net result of the above changes is to insert the desired "0" to "1" transition in front of each subcycle pulse. The insertion of the LSB pulses is controlled by the second 703 and last counter 707 exactly as it is in the example without edge control.

In order to make the PWM Output signal accurately represent a file containing a sine wave or voice data, the data cannot be directly loaded into a PWM in 2's complement format. A full scale/2 offset must first be added so that "000 . . ." in the 2's complement format becomes "100 . . ." in the format acceptable to the PWM. Therefore the filtered output of a PWM with a "0" input=Vref/2. The half scale DC offset must either be subtracted off in the analog domain or canceled by using a differential output. A differential output uses one pin for the PWM output and a second pin for the logical inverse of the PWM output. If the averaging filter and load are connected across these two terminals, then the differential PWM output for a "0" input, converted to "1000 . . . " by adding one-half full scale to the "2s" complement representation, will be "0". Using this type of number system to operate the PWM, it can be seen that the edge control circuit does not affect the DC component of the output. The contribution of the edge control pulses is always an equal number of 1s and 0s which represents "0". Edge control only results in a slight reduction in the gain of the PWM. The effect of this reduction is equal to: (cycle—(edge control bits))/cycle. In the example of FIG. 8, the signal is reduced by: (24–8)/24=2/3. A comparable 8-bit case would only be reduced by: (288–32)/288=8/9. It is noted that the use of the differential output increases the gain of the PWM by a factor of 2. Edge control can also be implemented with a similar 1 - to- 0 transition at the end of a normal pulse. Any number of "1s" and "0s" can be added to the waveform as long as the number of additional 1s equals the number of additional 0s. This is useful to adjust the length of the cycle to a given data rate when the clock rate is fixed.

Figure 9:
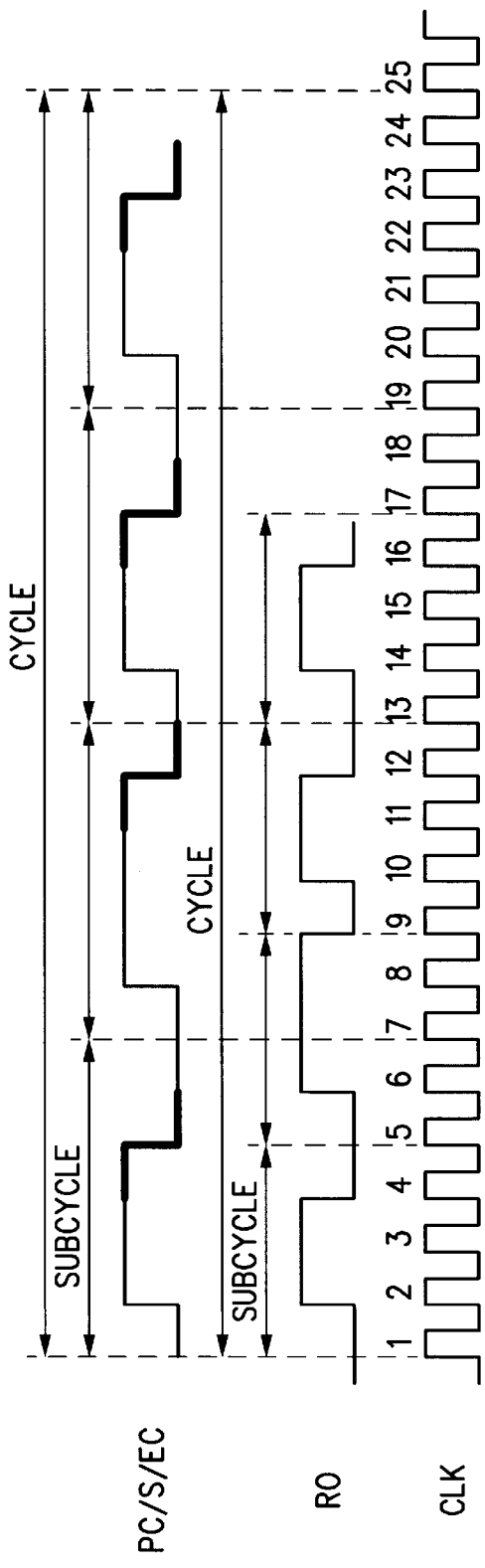
FIG. 9 is a waveform chart illustrating an output signals for a pulse centered and subcycle PWM, and also for a pulse centered, subcycle and edge controlled PWM.

FIG. 9 is a waveform chart illustrating output signals for a combination pulse centered and subcycle PWM "RO" (four bit case with a "1001" input), and also for a pulse centered, subcycle and edge controlled PWM ("PC/S/EC"). Pulse Centered, Subcycle, and Edge Controlled PWM can be combined in almost any combination. For the PC/S/EC signal illustrated, edge control has been applied to the trailing edge of the normal pulses.

When designing filters for a PWM, a fundamental limitation is the cycle period of the PWM. The inverse of this period is the sampling frequency of the input data. For example, if voice data has been sampled at the telephony rate of 8 KHz and stored in a file, the file must be read or sampled at a rate of 8 KHz in order to accurately reproduce the voice. The PWM must be designed to receive a new data word each 125 usec (⅛ KHz), so one cycle of the PWM must also be 125 usec. In the frequency domain "images" of the desired signal will appear around multiples of the 8 KHz sampling frequency. As an example, a 500 Hz signal would have images at 7500 Hz, 8500 Hz, 15500 Hz and 16500 Hz, etc. Many of these images are in the audio range and must be filtered. External analog filtering for this purpose is difficult because it is possible for the images to appear very close in frequency to the desired signal. A common solution to this problem is to increase the sampling rate, either by storing the data at a higher rate or "interpolating" the data to a higher rate with a digital interpolating filter.

However, when data is loaded into a standard PWM at a higher rate, the output clock rate must be increased by a proportional amount. This quickly becomes impractical since, for example, an 8-bit standard PWM operating at an 8 KHz sample rate must have a clock rate of (8000*256) or 2.048 MHz. If the sample rate is increased by a factor of 16 to 128 KHz, the clock rate becomes 32.768 MHz. This problem can be solved by using some form of a Subcycle PWM, an example of which is illustrated in FIG. 5. Empirical data shows that the subcycle PWM can be updated at the subcycle rate instead of the cycle rate with only a slight degradation in the signal to noise plus distortion figure of merit. To extend the example, the standard PWM can be replaced with a Subcycle PWM with a cycle length of 256 CLKs divided into 16 subcycles, each with a cycle length of 16 CLKs. The clock rate will remain 2.048 MHz, but the data can be input to the Subcycle PWM at the subcycle rate of 128 KHz. The images of the input signal will now appear around multiples of 128 KHz instead of 8 KHz. Filtering of the images is greatly simplified at these higher frequencies.

Figure 10:
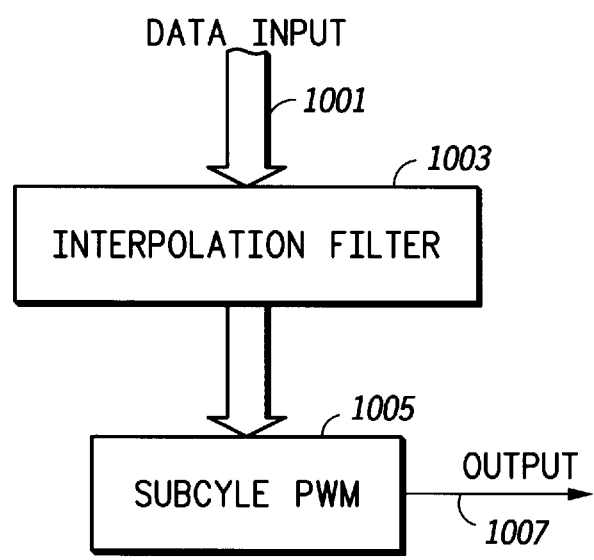
FIG. 10 is a block diagram illustrating an additional PWM circuit configuration.

FIG. 10 shows an additional circuit arrangement including an Interpolation Filter 1003 which receives voice or similar data as DATA INPUT 1001. The DATA INPUT 1001 is increased in frequency or oversampled by the Interpolation Filter 1003 and applied to a Subcycle PWM circuit 1005 which provides an OUTPUT 1007. The Subcycle PWM circuit 1005 may be any subcycle PWM circuit including those hereinbefore illustrated in FIG. 5 and FIG. 7.

The method and apparatus of the present invention has been described in connection with the preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

I claim:

1. A signal generating device for generating an output signal, said signal generating device comprising:

output signal generating circuitry arranged to receive a clock input signal and a period input signal, said output signal generating circuitry being selectively operable to provide an output signal, said input period signal being representative of a selected period for said output signal, said output signal generating circuitry being selectively operable to generate said output signal having said selected period, said output signal having at least one pulse signal portion thereof;

pulse positioning circuitry coupled to said output signal generating circuitry, said pulse positioning circuitry being selectively operable in response to a variable positioning input signal for selectively positioning said pulse signal portion of said output signal within said period of said output signal; and subcycle circuitry arranged to receive a subcycle signal, said subcycle signal being representative of a selected number of subcycles within said output period, said output signal generating circuitry being operable to generate said output signal having said selected number of subcycles within said output period, said output signal further including at least one pulse signal portion in each of said subcycles.

2. The signal generating device as set forth in claim 1 wherein said pulse positioning circuitry further includes a delay circuitry, said delay circuitry being selectively operable to delay said pulse signal portion of said output signal relative to a beginning of said period of said output signal.

3. The signal generating device as set forth in claim 2 wherein said pulse positioning circuitry further includes pulse width circuitry, said pulse width circuitry being responsive to a pulse width input signal to selectively set pulse widths for at least one of said pulse signal portions of said output signal.

4. The signal generating device as set forth in claim 1 wherein said pulse positioning circuitry includes centering circuitry, said centering circuitry being selectively operable to center said pulse signal portion of said output signal within said period of said output signal.

5. The signal generating device as set forth in claim 2 wherein said pulse positioning circuitry includes centering circuitry, said centering circuitry being selectively operable to center said pulse signal portion of said output signal within said period of said output signal.

6. The signal generating device as set forth in claim 3 wherein said pulse positioning circuitry includes centering circuitry, said centering circuitry being selectively operable to center said pulse signal portion of said output signal within said period of said output signal.

7. The signal generating device as set forth in claim 1 wherein said clock input signal comprises a continuous series of clock pulses, said output period corresponding to a first number of clock pulses, said subcycles defining a subcycle width corresponding to a second number of clock pulses.

8. The signal generating device as set forth in claim 2 wherein said clock input signal comprises a continuous series of clock pulses, said output period corresponding to a first number of clock pulses, said subcycles defining a subcycle width corresponding to a second number of clock pulses.

9. The signal generating device as set forth in claim 3 wherein said clock input signal comprises a continuous series of clock pulses, said output period corresponding to a first number of clock pulses, said subcycles defining a subcycle width corresponding to a second number of clock pulses.

10. The signal generating device as set forth in claim 1 wherein said signal generating device further includes edge controlling circuitry, said edge controlling circuitry being selectively operable to add at least one transition to at least one edge of pulses within said output signal thereby making transition occurrences in said output signal independent of input signals to the signal generating device.

11. The signal generating device as set forth in claim 3 wherein said output signal generating circuitry further includes a first counter circuit, said first counter circuit being arranged to receive said clock input signal and a first count input signal, said first count input signal being representative of a first count number corresponding to a selected period for said output signal, said first counter circuit being operable to provide an end period signal after counting down from said first count number; said signal generating device further including a second counter circuit, said second counter circuit being arranged to receive said clock input signal and a second count input signal, said second count input signal being representative of a second count number corresponding to a selected delay time between a beginning of a period of said output signal and a beginning of at least a first of said pulse signal portions; and said signal generating device further including a third counter circuit, said third counter circuit being arranged to receive said clock input signal and a third count input signal, said third count input signal being representative of a third count input number corresponding to a selected pulse width for at least one of said pulse signal portions.

12. The signal generating device as set forth in claim 10 wherein said pulse positioning circuitry includes centering circuitry, said centering circuitry being selectively operable to center said pulse signal portion of said output signal within said period of said output signal.

13. A method for generating a pulse width modulated output signal comprising:

providing a clock input signal;

providing a period input signal indicative of a selected period for the pulse width modulated output signal;

providing a pulse positioning input signal representative of a selected position within the selected output period to be occupied by at least one output signal pulse;

combining said clock input signal, said period input signal and said pulse positioning input signal;

providing a pulse width modulated output signal having said selected output period, said pulse width modulated output signal further including at least one pulse portion therein, said pulse portion being positioned in accordance with said pulse positioning input signal;

dividing said output period into subcycle periods; and generating a pulse portion for each of said subcycle periods, whereby said pulse width modulated output signal is comprised of a number of said subcycle periods.

14. The method as set forth in claim 13 and further including:

delaying said pulse portion relative to a beginning of said period of said output signal.

15. The method as set forth in claim 14 wherein said pulse portion has a pulse width thereof, said method further including:

adjusting the pulse width of said pulse portion in accordance with a pulse width input signal.

16. The method as set forth in claim 15 and further including:

increasing input rates of said pulse width input signal and said pulse positioning input signal to a rate higher than a rate corresponding to said selected output period in order to move frequency domain images of said input signals to a higher frequency level.

17. The method as set forth in claim 16 and further including:

filtering out of said frequency domain images of said input signals at said higher frequency level.

18. The method as set forth in claim 13 and further including:

re-clocking said pulse width modulated output signal to make circuit delays independent of said input signals.

19. The method as set forth in claim 14 and further including:

re-clocking said pulse width modulated output signal to make circuit delays independent of said input signals.

20. The method as set forth in claim 15 and further including:

re-clocking said pulse width modulated output signal to make circuit delays independent of said input signals.

21. A signal generating device for generating an output signal, said signal generating device comprising:

output signal generating circuitry arranged to receive a clock input signal and a period input signal, said output signal generating circuitry being selectively operable to provide an output signal, said input period signal being representative of a selected period for said output signal, said output signal generating circuitry being selectively operable to generate said output signal having said selected period, said output signal having at least one pulse signal portion thereof and at least one cycle;

pulse positioning circuitry coupled to said output signal generating circuitry, said pulse positioning circuitry being selectively operable in response to a variable positioning input signal for selectively positioning said pulse signal portion of said output signal within said period of said output signal; and edge controlling circuitry, said edge controlling circuitry being selectively operable to add at least one transition to at least one edge of pulses within said output signal thereby making transition occurrences in said output signal independent of input signals to the signal generating device, wherein each cycle has a same number of transitions.

22. The signal generating device as set forth in claim 21 wherein said pulse positioning circuitry includes centering circuitry, said centering circuitry being selectively operable to center said pulse signal portion of said output signal within said period of said output signal.

23. A signal generating device for generating an output signal, said signal generating device comprising:

output signal generating circuitry arranged to receive a clock input signal and a period input signal, said output signal generating circuitry being selectively operable to provide an output signal, said input period signal being representative of a selected period for said output signal, said output signal generating circuitry being selectively operable to generate said output signal having said selected period, said output signal having at least one pulse signal portion thereof, and wherein:

said output signal generating circuitry further includes a first counter circuit, said first counter circuit being arranged to receive said clock input signal and a first count input signal, said first count input signal being representative of a first count number corresponding to a selected period for said output signal, said first counter circuit being operable to provide an end period signal after counting down from said first count number; said signal generating device further including a second counter circuit, said second counter circuit being arranged to receive said clock input signal and a second count input signal, said second count input signal being representative of a second count number corresponding to a selected delay time between a beginning of a period of said output signal and a beginning of at least a first of said pulse signal portions; and said signal generating device further including a third counter circuit, said third counter circuit being arranged to receive said clock input signal and a third count input signal, said third count input signal being representative of a third count input number corresponding to a selected pulse width for at least one of said pulse signal portions; and pulse positioning circuitry coupled to said output signal generating circuitry, said pulse positioning circuitry being selectively operable in response to a variable positioning input signal for selectively positioning said pulse signal portion of said output signal within said period of said output signal.

24. The signal generating device as set forth in claim 23 wherein said pulse positioning circuitry further includes a delay circuitry, said delay circuitry being selectively operable to delay said pulse signal portion of said output signal relative to a beginning of said period of said output signal.

25. The signal generating device as set forth in claim 24 wherein said pulse positioning circuitry further includes pulse width circuitry, said pulse width circuitry being responsive to a pulse width input signal to selectively set pulse widths for at least one of said pulse signal portions of said output signal.

* * * * *